(12) United States Patent
Bae et al.

(10) Patent No.: US 9,165,759 B2
(45) Date of Patent: Oct. 20, 2015

(54) ETCHING COMPOSITION AND METHOD OF MANUFACTURING SEMICONDUCTOR DEVICE USING THE SAME (71) Applicant: SAMSUNG ELECTRONICS CO., LTD., Suwon-si, Gyeonggi-do (KR)

(72) Inventors: Sang Won Bae, Suwon-si (KR); Yongsun Ko, Suwon-si (KR); Byoungho Kwon, Hwaseong-si (KR); Bo yun Kim, Hwaseong-si (KR); Hongjin Kim, Seoul (KR); Sungoh Park, Seoul (KR); Kuntack Lee, Suwon-si (KR); Hyosan Lee, Suwon-si (KR); Sol Han, Gyeonggi-do (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 149 days.

(21) Appl. No.: 14/086,426

(22) Filed: Nov. 21, 2013

(65) Prior Publication Data

US 2014/0141616 A1    May 22, 2014

(30) Foreign Application Priority Data

Nov. 21, 2012    (KR) ................... 10-2012-0132476

(51) Int. Cl.
*H01L 21/302* (2006.01)
*H01L 21/02* (2006.01)
*H01L 21/3213* (2006.01)
*H01L 21/768* (2006.01)

(52) U.S. Cl.
CPC .... *H01L 21/02074* (2013.01); *H01L 21/32134* (2013.01); *H01L 21/76883* (2013.01); *H01L 21/76865* (2013.01)

(58) Field of Classification Search
None
See application file for complete search history.

(56) References Cited

U.S. PATENT DOCUMENTS

| 6,315,883 | B1 | 11/2001 | Mayer et al. | |
| 6,696,338 | B2 | 2/2004 | Oh et al. | |
| 6,830,628 | B2 | 12/2004 | Bergman | |
| 2003/0209514 | A1 | 11/2003 | Ramachandran et al. | |
| 2004/0038840 | A1* | 2/2004 | Lee et al. | 510/202 |
| 2012/0187335 | A1* | 7/2012 | Sinha et al. | 252/79.3 |
| 2013/0183824 | A1* | 7/2013 | Kwon et al. | 438/653 |

FOREIGN PATENT DOCUMENTS

| JP | 2011-202242 | 10/2011 |
| KR | 10-2004-0011041 A | 2/2004 |
| KR | 10-2009-0038590 A | 4/2009 |
| KR | 10-2010-0040352 A | 4/2010 |
| KR | 10-2010-0090538 A | 8/2010 |
| KR | 10-2012-0024844 A | 3/2012 |
| KR | 10-2012-0044630 A | 5/2012 |

* cited by examiner

*Primary Examiner* — Anita Alanko
(74) *Attorney, Agent, or Firm* — Lee & Morse, P.C.

(57) ABSTRACT

An etching composition includes about 1 wt % to about 7 wt % of hydrogen peroxide, about 20 wt % to about 80 wt % of phosphoric acid, about 0.001 wt % to about 1 wt % of an amine or amide polymer, 0 wt % to about 55 wt % of sulfuric acid, and about 10 wt % to about 45 wt % of deionized water.

15 Claims, 6 Drawing Sheets

ETCHING COMPOSITION AND METHOD OF MANUFACTURING SEMICONDUCTOR DEVICE USING THE SAME

CROSS-REFERENCE TO RELATED APPLICATION

Korean Patent Application No. 10-2012-0132476, filed on Nov. 21, 2012, in the Korean Intellectual Property Office, and entitled: "Etching Composition and Method of Manufacturing Semiconductor Device Using the Same," is incorporated by reference herein in its entirety.

BACKGROUND

1. Field

Embodiments relate to an etching composition and a method of manufacturing a semiconductor device using the same and, more particularly, to a metal etching composition having a high etch-selectivity and a method of manufacturing a semiconductor device using the same.

2. Description of the Related Art

Semiconductor devices are attractive in the electronic industry because of their small size, multi-functionality, and/or low manufacturing costs. Semiconductor devices may be categorized as any one of semiconductor memory devices storing logic data, semiconductor logic devices processing operations of logical data, and hybrid semiconductor devices having both the function of the semiconductor memory devices and the function of the semiconductor logic devices.

High speed and/or low operation voltage semiconductor devices having high reliability have been increasingly in demand for use in high speed and/or low power consumption of electronic devices. Semiconductor devices are being highly integrated for satisfying these demands.

SUMMARY

Embodiments are directed to an etching composition including about 1 wt % to about 7 wt % of hydrogen peroxide, about 20 wt % to about 80 wt % of phosphoric acid, about 0.001 wt % to about 1 wt % of an amine or amide polymer, 0 wt % to about 55 wt % of sulfuric acid, and about 10 wt % to about 45 wt % of deionized water.

The amine or amide polymer may include at least one of poly(2-dimethylaminoethyl methacrylate), poly(2-methacryloxyethyltrimethylammonium bromide), poly(2-vinyl-1-methylpyridinium bromide), poly(2-vinylpyridine N-oxide), poly(2-vinylpyridine), poly(3-chloro-2-hydroxypropyl-2-methacryloxyethyldimethylammonium chloride), poly(4-aminostyrene), poly(4-vinylpyridine N-oxide), poly(4-vinylpyridine), poly(allylamine), poly(allylamine hydrochloride), poly(butadiene/acrylonitrile), amine terminated, poly(diallyldimethylammonium chloride), poly(ethylene glycol)bis(2-aminoethyl), poly(1-lysine hydrobromide), poly(N-methylvinylamine), poly(N-vinylpyrrolidone), poly(N-vinylpyrrolidone/2-dimethylaminoethyl methacrylate) dimethyl sulfate quaternary, poly(vinylamine) hydrochloride, polyaniline, or polyethylenimine.

The etching composition may be formulated to etch a metal layer that includes a first metal layer and a second metal layer, wherein the first metal layer includes titanium (Ti) or titanium nitride (TiN) and the second metal layer includes tungsten (W).

The etching composition may be formulated such that an etch rate ratio of the first metal layer to the second metal layer may be about 10:1 or more.

The etching composition may be formulated such that an etch rate of the first metal layer is about 100 Å/min or more.

Embodiments are also directed to a method of manufacturing a semiconductor device including forming a first metal layer on a substrate, forming a second metal layer on the first metal layer, polishing the first metal layer and the second metal layer, and cleaning the first metal layer and the second metal layer using a cleaning solution. The cleaning solution includes about 1 wt % to about 7 wt % of hydrogen peroxide, about 20 wt % to about 80 wt % of phosphoric acid, about 0.001 wt % to about 1 wt % of an amine or amide polymer, 0 wt % to about 55 wt % of sulfuric acid, and about 10 wt % to about 45 wt % of deionized water.

The first metal layer may include titanium (Ti) or titanium nitride (TiN). The second metal layer may include tungsten (W).

Cleaning the first metal layer and the second metal layer using the cleaning solution may be performed such that a ratio of an etch rate of the first metal layer to an etch rate of the second metal layer by the cleaning solution may be about 10:1 or more.

Cleaning the first metal layer and the second metal layer using the cleaning solution may be performed such that an etch rate of the first metal layer by the cleaning solution may be about 100 Å/min or more.

Cleaning the first metal layer and the second metal layer may include spraying the cleaning solution.

Forming the first metal layer may include forming an insulating layer including a recess on the substrate, and depositing the first metal layer on the insulating layer. The first metal layer may be formed to partially fill the recess.

Forming the second metal layer may include filling a remaining region of the recess on the first metal layer.

Polishing the first metal layer and the second metal layer may be performed until a top surface of the insulating layer is exposed.

Embodiments are also directed to a method of manufacturing a semiconductor device including providing an insulating layer having a recess, forming a first metal layer on a bottom surface and side surfaces of the recess and on a top surface of the insulating layer, forming a second metal layer on the first metal layer, the second metal layer filling a remaining portion of the recess, polishing the first metal layer and the second metal layer to expose the top surface of the insulating layer and to provide exposed top surfaces of the first metal layer and the second metal layer coplanar with the top surface of the insulating layer, cleaning the exposed top surfaces of first metal layer and the second metal layer using a cleaning solution that partially etches the first metal layer and the second metal layer, the cleaning solution having a high etching selectivity with respect to the second metal layer such that a top surface of the first metal layer as etched by the cleaning solution is lower than a top surface of the second metal layer as etched by the cleaning solution. The cleaning solution includes about 1 wt % to about 7 wt % of hydrogen peroxide, about 20 wt % to about 80 wt % of phosphoric acid, about 0.001 wt % to about 1 wt % of an amine or amide polymer, 0 wt % to about 55 wt % of sulfuric acid, and about 10 wt % to about 45 wt % of deionized water.

The amine or amide polymer may include at least one of poly(2-dimethylaminoethyl methacrylate), poly(2-methacryloxyethyltrimethylammonium bromide), poly(2-vinyl-1-methylpyridinium bromide), poly(2-vinylpyridine N-oxide), poly(2-vinylpyridine), poly(3-chloro-2-hydroxypropyl-2-methacryloxyethyldimethylammonium chloride), poly(4-aminostyrene), poly(4-vinylpyridine N-oxide), poly(4-vinylpyridine), poly(allylamine), poly(allylamine hydrochloride), poly(butadiene/acrylonitrile), amine terminated, poly(diallyldimethylammonium chloride), poly(ethylene glycol)bis(2-aminoethyl), poly(1-lysine hydrobromide), poly(N-methylvinylamine), poly(N-vinylpyrrolidone), poly(N-vinylpyrrolidone/2-dimethylaminoethyl methacrylate) dimethyl sulfate quaternary, poly(vinylamine) hydrochloride, polyaniline, and polyethylenimine.

The amine or amide polymer is polyacrylamide or polyethylenimine.

The first metal layer may include titanium (Ti) or titanium nitride (TiN). The second metal layer may include tungsten (W).

A ratio of an etch rate of the first metal layer to an etch rate of the second metal layer by the cleaning solution may be about 10:1 or more.

An etch rate of the first metal layer by the cleaning solution may be about 100 Å/min or more.

The bottom surface of the recess may be a top surface of a capacitor.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Like reference numerals refer to like elements throughout.

The terminology used herein is for the purpose of describing particular embodiments only and is not intended to be limiting. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views. Accordingly, shapes of the exemplary views may be modified according to manufacturing techniques and/or allowable errors. Therefore, the embodiments are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings thereof. Exemplary embodiments explained and illustrated herein include their complementary counterparts.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

An etching composition according to embodiments may include hydrogen peroxide having a content of about 1 wt % to about 7 wt %, phosphoric acid having a content of about 20 wt % to about 80 wt %, an amine or amide polymer having a content of about 0.001 wt % to about 1 wt %, sulfuric acid having a content of about 0 wt % to about 55 wt %, and deionized water having a content of about 10 wt % to about 45 wt %.

For example, the amine or amide polymer may include at least one of poly(2-dimethylaminoethyl methacrylate), poly(2-methacryloxyethyltrimethylammonium bromide), poly(2-vinyl-1-methylpyridinium bromide), poly(2-vinylpyridine N-oxide), poly(4-vinylpyridine), poly(3-chloro-2-hydroxypropyl-2-methacryloxyethyldimethylammonium chloride), poly(4-aminostyrene), poly(4-vinylpyridine N-oxide), poly(4-vinylpyridine), poly(allylamine), poly(allylamine hydrochloride), poly(butadiene/acrylonitrile), amine terminated, poly(diallyldimethylammonium chloride), poly(ethylene glycol)bis(2-aminoethyl), poly(1-lysine hydrobromide), poly(N-methylvinylamine), poly(N-vinylpyrrolidone), poly(N-vinylpyrrolidone/2-dimethylaminoethyl methacrylate)dimethyl sulfate quaternary, poly(vinylamine) hydrochloride, polyaniline, and polyethylenimine.

The etching composition may be used for etching a metal layer. The metal layer may include a first metal layer and a second metal layer. The first metal layer may include titanium (Ti) or titanium nitride (TiN), and the second metal layer may include tungsten (W).

The etching composition may have a high etch-selectivity with respect to the second metal layer. An etch-selectivity may be expressed by a ratio of etch rates of a material A and a material B. A high etch-selectivity with respect to the material A indicates that an etch rate of the material A is less than an etch rate of the material B for the same time under the same condition. An etch rate ratio of the first metal layer to the second metal layer by the etching composition may be about 10:1 or more. The etch rate of the first metal layer may be about ten or more times greater than the etch rate of the second metal layer in a process using the etching composition. The etch rate of the first metal layer by the etching composition may be about 100 Å/min or more.

Experiment Example 1

Etch Rates for Metal Layers with Respect to Hydrogen Peroxide Content

The hydrogen peroxide in the etching composition may etch the first metal layer and the second metal layer. The etch rates of the first and second metal layers may be controlled according to a temperature of the etching composition and a content of the hydrogen peroxide in the etching composition.

The following table 1 shows etch rates of tungsten (W) and titanium nitride (TiN) according to the temperature of the etching composition and the content of hydrogen peroxide in the etching composition. In the following table 1, each of sample compositions in the present experiment consists of the hydrogen peroxide, the phosphoric acid, and the deionized water.

TABLE 1

| Content of composition | Temperature | Etch rate of titanium nitride (TiN) | Etch rate of tungsten (W) | Etch rate ratio (TiN:W) |
|---|---|---|---|---|
| Sample 1<br>Hydrogen peroxide: 1.8 wt %<br>Phosphoric acid: 79.8 wt %<br>Deionized water: 18.4 wt % | 60° C. | 23.0 Å/min | 8.7 Å/min | 2.64:1 |
| Sample 2<br>Hydrogen peroxide: 1.8 wt %<br>Phosphoric acid: 79.8 wt %<br>Deionized water: 18.4 wt % | 70° C. | 62.1 Å/min | 23.7 Å/min | 2.62:1 |
| Sample 3<br>Hydrogen peroxide: 1.8 wt %<br>Phosphoric acid: 79.8 wt %<br>Deionized water: 18.4 wt % | 80° C. | 236.9 Å/min | 104.2 Å/min | 2.27:1 |
| Sample 4<br>Hydrogen peroxide: 3.5 wt %<br>Phosphoric acid: 75.1 wt %<br>Deionized water: 21.4 wt % | 60° C. | 60.5 Å/min | 44.1 Å/min | 1.37:1 |

As indicated in Table 1, the etch rates of the tungsten (W) and the titanium nitride (TiN) increase as the temperature of the etching composition increases. Additionally, the etch rates of tungsten (W) and titanium nitride (TiN) increase as the content of hydrogen peroxide increases in the etching composition. If the content of hydrogen peroxide is less than about 1 wt %, the etch rates of the tungsten (W) and the titanium nitride (TiN) may be reduced, such that it may be difficult to etch the first and second metal layers. On the other hand, if the content of hydrogen peroxide is greater than about 7 wt %, the etch rates of the tungsten (W) and the titanium nitride (TiN) may increase, such that the etch-selectivity of the etching composition with respect to the second metal layer may be reduced. Therefore, hydrogen peroxide may have a content of about 1 wt % to about 7 wt % in the etching composition.

Experiment Example 2

Etch Rates for Metal Layers with Respect to Phosphoric Acid Content

The phosphoric acid in the etching composition may reduce the etch rate of the second metal layer. The etch rates of the first and second metal layers may be controlled according to the content of phosphoric acid in the etching composition, thereby controlling the etch-selectivity of the etching composition with respect to the second metal layer.

The following Table 2 shows etch rates of tungsten (W) and titanium nitride (TiN) according to the content of phosphoric acid in the etching composition. In the following Table 2, each of samples 3 to 6 corresponding to experiment compositions consists of hydrogen peroxide, phosphoric acid, and deionized water. On the other hand, each of samples 1 and 2 corresponding to comparison compositions consists of hydrogen peroxide and deionized water and do not include phosphoric acid. In the present experiment example, the temperature of each of the compositions was 60° C.

TABLE 2

| Content of composition | Etch rate of titanium nitride (TiN) | Etch rate of tungsten (W) | Etch rate ratio (TiN:W) |
|---|---|---|---|
| Sample 1<br>Hydrogen peroxide: 3 wt %<br>Deionized water: 97 wt % | 12.7 Å/min | 440.3 Å/min | 0.03:1 |

TABLE 2-continued

| Content of composition | Etch rate of titanium nitride (TiN) | Etch rate of tungsten (W) | Etch rate ratio (TiN:W) |
|---|---|---|---|
| Sample 2<br>Hydrogen peroxide: 5.4 wt %<br>Deionized water: 94.6 wt % | 16.8 Å/min | 540.7 Å/min | 0.03:1 |

TABLE 2-continued

| Content of composition | Etch rate of titanium nitride (TiN) | Etch rate of tungsten (W) | Etch rate ratio (TiN:W) |
|---|---|---|---|
| Sample 3<br>Hydrogen peroxide: 4.2 wt %<br>Phosphoric acid: 45.8 wt %<br>Deionized water: 50 wt % | 38.2 Å/min | 228.5 Å/min | 0.17:1 |
| Sample 4<br>Hydrogen peroxide: 2.2 wt %<br>Phosphoric acid: 49.2 wt %<br>Deionized water: 48.5 wt % | 28.2 Å/min | 128.4 Å/min | 0.22:1 |
| Sample 5<br>Hydrogen peroxide: 3.5 wt %<br>Phosphoric acid: 75.1 wt %<br>Deionized water: 21.4 wt % | 60.5 Å/min | 44.1 Å/min | 1.37:1 |
| Sample 6<br>Hydrogen peroxide: 1.8 wt %<br>Phosphoric acid: 79.8 wt %<br>Deionized water: 18.4 wt % | 23.0 Å/min | 8.7 Å/min | 2.64:1 |

As indicated in Table 2, as the content of phosphoric acid increases in the experiment composition, the etch rate of the tungsten (W) is reduced and the etch-selectivity of the composition with respect to the tungsten increases. If the content of phosphoric acid is less than about 20 wt %, the etch rate of the tungsten W increases such that the etch-selectivity of the composition with respect to the second metal layer may be reduced. On the other hand, if the content of phosphoric acid is greater than about 80 wt %, the etch rate of the titanium nitride (TiN) may be reduced such that it may be difficult to etch the first metal layer. Therefore, phosphoric acid may have a content of about 20 wt % to about 80 wt % in the etching composition according to embodiments.

Experiment Example 3

Etch Rates for Metal Layers of the Amine or Amide Polymer

The amine or amide polymer in the etching composition may protect a surface of the second metal layer to inhibit the second metal layer from being etched.

The following Table 3 shows etch rates of tungsten (W) and titanium nitride (TiN) according to the content of the amine or amide polymer in the etching composition. In the following Table 3, each of samples 2 to 4 corresponding to experiment compositions consists of the amine or amide polymer (polyacrylamide (PAA) in sample 2 and polyethylenimine (PEI) in samples 3 and 4), the hydrogen peroxide, the phosphoric acid, and the deionized water. On the other hand, a sample 1 corresponding to a comparison composition consists of the hydrogen peroxide, the phosphoric acid, and the deionized water and does not include the amine or amide polymer. In the present experiment example, the temperature of each of the compositions was 80° C.

TABLE 3

| Content of composition | Etch rate of titanium nitride (TiN) | Etch rate of tungsten (W) | Etch rate ratio (TiN:W) |
|---|---|---|---|
| Sample 1<br>Hydrogen peroxide: 1.8 wt %<br>Phosphoric acid: 79.8 wt %<br>Deionized water: 18.4 wt % | 236.9 Å/min | 104.2 Å/min | 2.27:1 |
| Sample 2<br>Hydrogen peroxide: 1.8 wt %<br>Phosphoric acid: 79.8 wt %<br>Deionized water: 18.4 wt %<br>polyacrylamide (PAA):<br>0.01 wt % | 206.6 Å/min | 9.9 Å/min | 20.9:1 |
| Sample 3<br>Hydrogen peroxide: 1.8 wt %<br>Phosphoric acid: 79.8 wt %<br>Deionized water: 18.4 wt %<br>Poly(ethylenimine) (PEI):<br>0.01 wt % | 201.3 Å/min | 6.6 Å/min | 30.7:1 |
| Sample 4<br>Hydrogen peroxide: 3.5 wt %<br>Phosphoric acid: 75.1 wt %<br>Deionized water: 21.4 wt %<br>PEI: 0.05% | 380.5 Å/min | 7.5 Å/min | 50.5:1 |

As indicated in Table 3, the amine or amide polymer is added into the etching composition, such that the etch rate of the tungsten (W) is reduced and the etch-selectivity of the composition with respect to the tungsten (W) significantly increases. If the content of the amine or amide polymer is less than about 0.001 wt %, the tungsten (W) may not be inhibited from being etched such that the etch-selectivity of the composition with respect to the second metal layer may be reduced. On the other hand, if the content of the amine or amide polymer is greater than about 1 wt %, decomposition of the hydrogen peroxide may be accelerated. Thus, the etching composition may be unstable and it may be difficult to etch the tungsten (W) and the titanium nitride (TiN). Therefore, the amine or amide polymer may have a content of about 0.001 wt % to about 1 wt % in the etching composition according to embodiments.

Experiment Example 4

Etch Rates of Metal Layers According to Dilution

Deionized water may be added into the etching composition such that etching composition may be diluted. The deionized water may affect the etching of the second metal layer.

The following Table 4 shows etch rates of tungsten (W) and titanium nitride (TiN) according to a dilution degree of a composition diluted with deionized water. In the present experiment example, the temperature of each of the compositions was 80° C.

TABLE 4

| Content of composition | Etch rate of titanium nitride (TiN) | Etch rate of tungsten (W) | Etch rate ratio (TiN:W) |
|---|---|---|---|
| Sample 1<br>Hydrogen peroxide: 3.5 wt %<br>Phosphoric acid: 75.1 wt %<br>Deionized water: 21.4 wt %<br>Poly(ethylenimine) (PEI):<br>0.05 wt % | 380.5 Å/min | 7.5 Å/min | 50.5:1 |
| Sample 2<br>Hydrogen peroxide: 3.6 wt %<br>Phosphoric acid: 70.2 wt %<br>Deionized water: 26.2 wt %<br>PEI: 0.05 wt % | 315.5 Å/min | 4.7 Å/min | 67.8:1 |
| Sample 3<br>Hydrogen peroxide: 3.7 wt %<br>Phosphoric acid: 64.8 wt %<br>Deionized water: 31.5 wt %<br>PEI: 0.05 wt % | 299.6 Å/min | 9.8 Å/min | 30.6:1 |
| Sample 4<br>Hydrogen peroxide: 3.9 wt %<br>Phosphoric acid: 58.9 wt %<br>Deionized water: 37.2 wt %<br>PEI: 0.05 wt % | 268.3 Å/min | 17.8 Å/min | 15.1:1 |

TABLE 4-continued

| Content of composition | Etch rate of titanium nitride (TiN) | Etch rate of tungsten (W) | Etch rate ratio (TiN:W) |
|---|---|---|---|
| Sample 5<br>Hydrogen peroxide: 4.1 wt %<br>Phosphoric acid: 52.6 wt %<br>Deionized water: 43.3 wt %<br>PEI: 0.05 wt % | 218.9 Å/min | 17.4 Å/min | 12.6:1 |
| Sample 6<br>Hydrogen peroxide: 4.4 wt %<br>Phosphoric acid: 38.3 wt %<br>Deionized water: 57.3 wt %<br>PEI: 0.05 wt % | 192.5 Å/min | 37.6 Å/min | 5.1:1 |
| Sample 7<br>Hydrogen peroxide: 5.4 wt %<br>Deionized water: 94.6 wt %<br>PEI: 0.05 wt % | 41.4 Å/min | 143.4 Å/min | 0.29:1 |

As indicated in Table 4, when the content of deionized water is greater than about 30 wt %, the etch rate of the tungsten (W) increases such that the etch-selectivity of the composition with respect to the tungsten (W) significantly increases. Additionally, when the content of deionized water is greater than about 45 wt %, the etch rate ratio of the titanium nitride (TiN) to the tungsten (W) is less than about 10:1. Thus, if the content of deionized water is less than about 10 wt % or is greater than about 45 wt %, the selective etching for the first and second metal layers may be difficult. Therefore, deionized water may have a content of about 10 wt % to about 45 wt % in the etching composition according to embodiments.

Experiment Example 5

Etch Rates for Metal Layers of Sulfuric Acid

The etching composition may further include sulfuric acid. When sulfuric acid is added into the etching composition, the sulfuric acid may effectively remove an organic impurity that may exist on the first and second metal layers. Etch rates of the first and second metal layers may be varied depending on the content of sulfuric acid in the etching composition.

The following Table 5 shows etch rates of tungsten (W) and titanium nitride (TiN) according to the content of sulfuric acid in the etching composition. In the following Table 5, a sample 1 corresponding to a comparison composition consists of the amine or amide polymer, the hydrogen peroxide, the phosphoric acid, and the deionized water and does not include sulfuric acid. In the present experiment, the temperature of each of the compositions was 80° C.

TABLE 5

| Content of composition | Etch rate of titanium nitride (TiN) | Etch rate of tungsten (W) | Etch rate ratio (TiN:W) |
|---|---|---|---|
| Sample 1<br>Hydrogen peroxide: 5.4 wt %<br>Phosphoric acid: 69.8 wt %<br>Deionized water: 24.9 wt %<br>Poly(ethylenimine) (PEI):<br>0.05 wt % | 296.3 Å/min | 6.1 Å/min | 48.6:1 |
| Sample 2<br>Hydrogen peroxide: 5.2 wt %<br>Phosphoric acid: 45.3 wt %<br>Deionized water: 21.4 wt %<br>Sulfuric acid: 28.0 wt %<br>PEI: 0.05 wt % | 303.3 Å/min | 7.6 Å/min | 40.0:1 |
| Sample 3<br>Hydrogen peroxide: 5.1 wt %<br>Phosphoric acid: 22.1 wt %<br>Deionized water: 18.1 wt %<br>Sulfuric acid: 54.7 wt %<br>PEI: 0.05 wt % | 198.4 Å/min | 4.5 Å/min | 44.0:1 |
| Sample 4<br>Hydrogen peroxide: 5.0 wt %<br>Sulfuric acid: 80.0 wt %<br>Deionized water: 15.0 wt %<br>PEI: 0.05 wt % | 152.1 Å/min | 7.5 Å/min | 20.4:1 (excessive generation of heat) |

Figure 5:
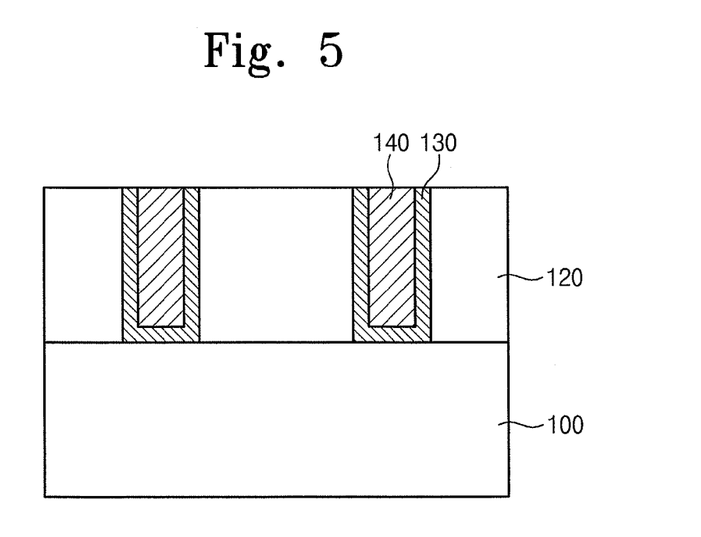

As indicated in FIG. 5, the etch rate ratios of titanium nitride (TiN) to tungsten (W) was greater than about 10:1 in the sample 1 not including the sulfuric acid and the samples 2 to 4 including the sulfuric acid. In other words, all of the samples 1 to 4 have the high etch-selectivity with respect to the tungsten (W). However, heat was excessively generated when the content of the sulfuric acid was greater than about 55 wt %. It can be concluded that if the content of sulfuric acid is higher than about 55 wt %, an apparatus may be unstable due to the heat generated by reaction between the sulfuric acid and the hydrogen peroxide and a lifetime of the etching composition may be reduced. Therefore, sulfuric acid may have the content of about 0 wt % to about 55 wt % in the etching composition according to embodiments.

In an embodiment, the etching composition may include hydrogen peroxide in an amount of about 1.8 wt %, phosphoric acid in an amount of about 79.79 wt %, an amine or amide polymer in an amount of about 0.01 wt %, and deionized water in an amount of about 18.4 wt %. The etch rate ratio of the titanium nitride (TiN) to the tungsten (W) by the etching composition may be about 30:1 or more. Thus, the etching composition may have a high etch-selectivity with respect to the tungsten (W). Additionally, the etch rate of the titanium nitride (TiN) by the etching composition may be about 200 Å/min or more.

In another embodiment, the etching composition may include hydrogen peroxide in an amount of about 5.1 wt %, phosphoric acid in an amount of about 22.1 wt %, sulfuric acid in an amount of about 54.65 wt %, the amine or amide polymer in an amount of about 0.05 wt %, and deionized water in an amount of about 18.1 wt %. The etch rate ratio of the titanium nitride (TiN) to the tungsten (W) by this etching composition may be about 44:1, such that this etching composition may have the high etch-selectivity with respect to the tungsten (W). Additionally, the etch rate of the titanium nitride (TiN) by this etching composition may be about 198 Å/min or more.

The etching composition according to embodiments may maintain a predetermined level or more of the etch rate of the first metal layer (e.g., titanium nitride) and may have the high etch-selectivity with respect to the second metal layer (e.g., tungsten). Thus, the etching composition may be effectively used for a semiconductor manufacturing process requiring the high etch-selectivity with respect to the second metal layer.

A method of manufacturing a semiconductor device using the etching composition according to embodiments will be described hereinafter.

Figure 1:
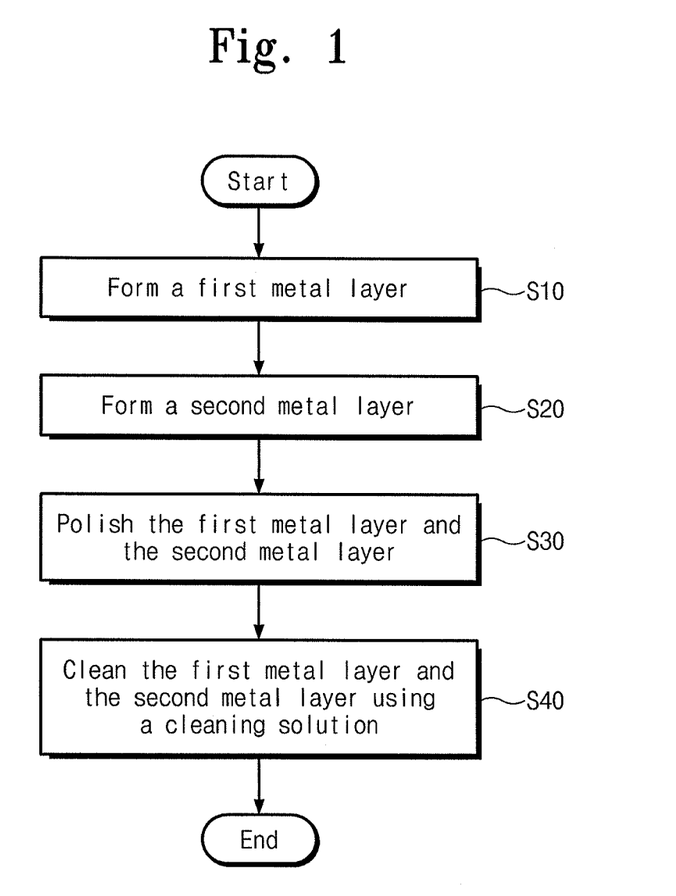
FIG. 1 illustrates a flowchart depicting a method of manufacturing a semiconductor device according to an exemplary embodiment.

FIG. 1 illustrates a flowchart depicting a method of manufacturing a semiconductor device according to exemplary embodiments, and FIGS. 2 to 6 illustrate cross-sectional views depicting stages of a method of manufacturing a semiconductor device according to exemplary embodiments.

Figure 2:
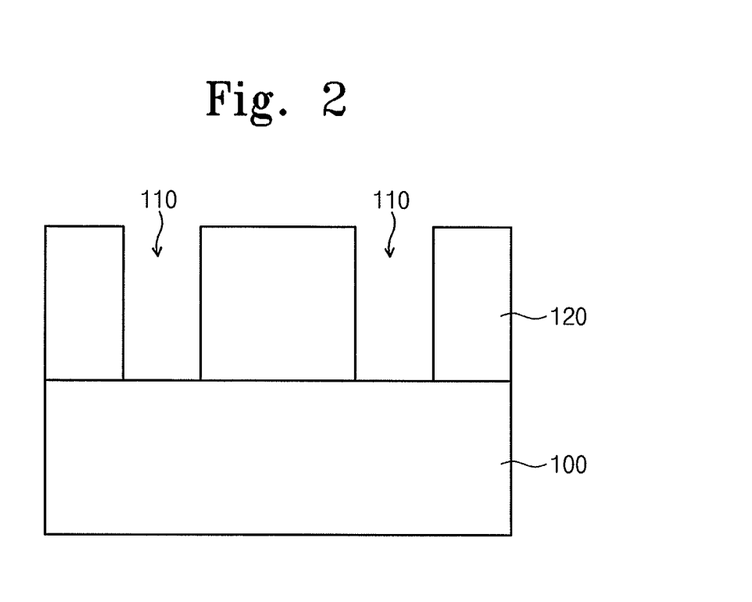
FIGS. 2 to 6 illustrate cross-sectional views depicting stages of a method of manufacturing a semiconductor device according to an exemplary embodiment.

Referring to FIG. 2, an insulating layer 120 having a recess 110 may be formed on a lower structure 100. In an embodiment, the lower structure 100 may include a substrate. In another embodiment, the lower structure 100 may include a transistor, a capacitor, and/or a metal pattern formed on the substrate. The insulating layer 120 may include, for example, a silicon oxide layer. The recess 110 may penetrate the insulating layer 120 to expose a top surface of the lower structure 100. The recess 110 may have a hole-shape or a linear shape extending in one direction.

Figure 3:
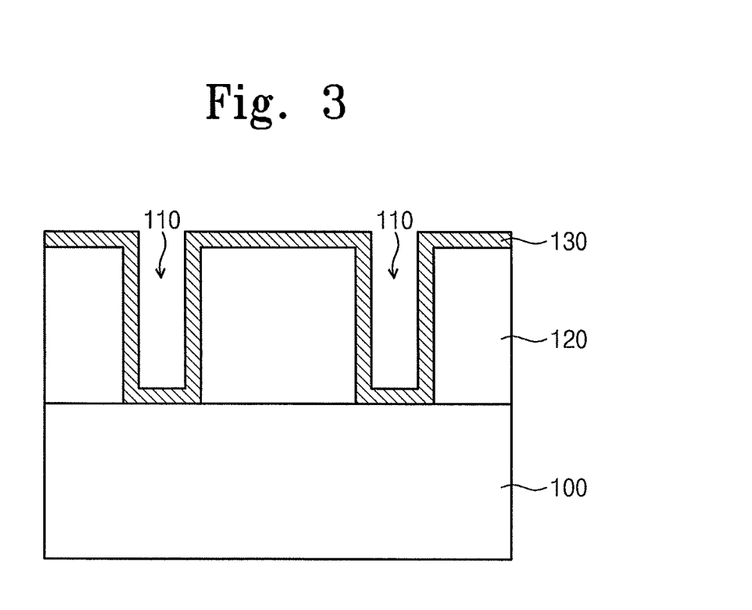

Referring to FIGS. 1 and 3, a first metal layer 130 may be formed on the insulating layer 120 including the recess 110 (S10). The first metal layer 130 may be formed to partially fill the recess 110. For example, the first metal layer 130 may be conformally formed on bottom and side surfaces of the recess and a top surface of the insulating layer. In an implementation, the first metal layer 130 may include titanium (Ti) or titanium nitride (TiN).

Figure 4:
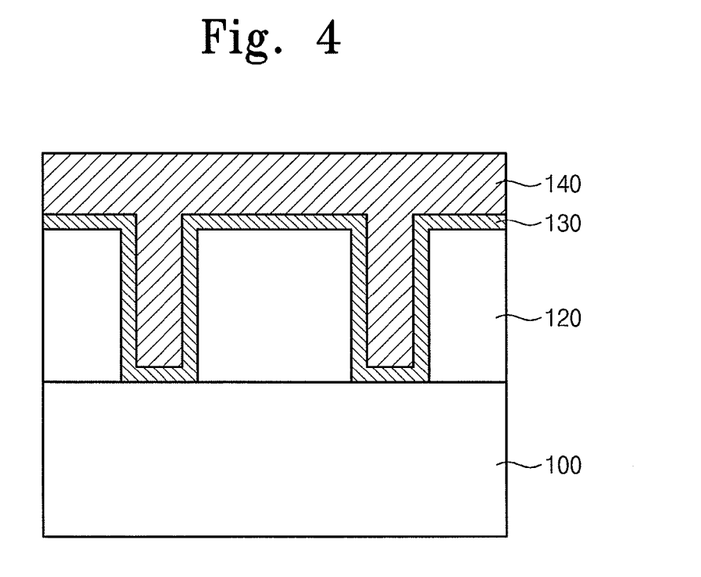

Referring to FIGS. 1 and 4, a second metal layer 140 is formed on the first metal layer 130 (S20). The second metal layer 140 may be formed to fill a remaining portion region of the recess 110. The second metal layer 140 may completely fill the recess 110. In an implementation, the second metal layer 140 may include tungsten (W).

Referring to FIGS. 1 and 5, the second metal layer 140 and the first metal layer 130 may be polished (S30). In more detail, a top surface of the second metal layer 140 and a top surface of the first metal layer 130 may be polished. The polishing process may be performed by a chemical mechanical polishing (CMP) process. The top surfaces of the second and first metal layers 140 and 130 may be mechanically polished by pressurization and rotation and may be chemically polished by an abrasive provided on the top surfaces of the second and first metal layers 140 and 130 at the same time. The polishing process may be performed until a top surface of the insulating layer 120 is exposed.

During the polishing process, a first metal (e.g., Ti or TiN) and a second metal (e.g., W) may be separated from the first metal layer 130 and the second metal layer 140, respectively. The first metal, the second metal, and/or the polished insulating layer 120 may chemically react with the abrasive to generate a polishing by-product. The separated first metal and second metal, and the polishing by-product may correspond to impurities caused by the polishing process and may have harmful effects in subsequent processes.

As described above, the second and first metal layers 140 and 130 may be planarized by the CMP process. In another implementation, the second and first metal layers 140 and 130 may be planarized by an etch-back process. Impurities generated during the etch-back process may also have harmful effects in the subsequent processes.

Figure 6:
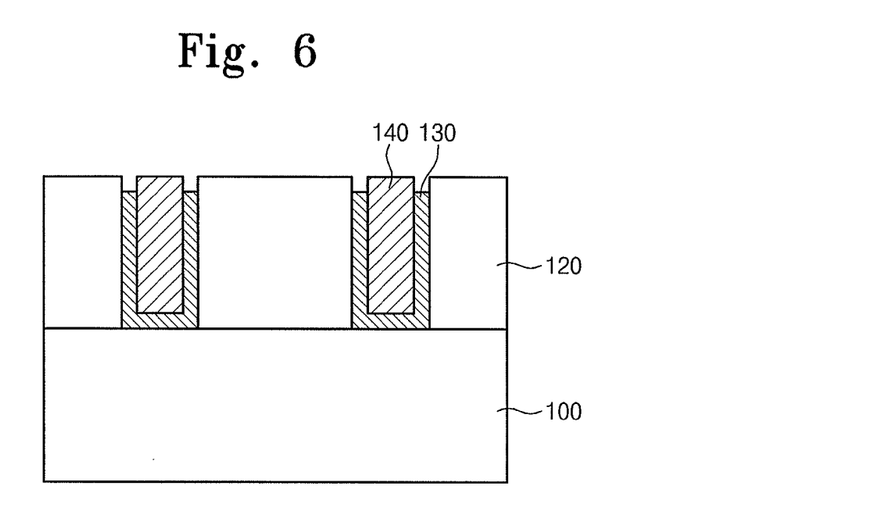

Referring to FIGS. 1 and 6, the first and second metal layers 130 and 140 may be cleaned using a cleaning solution for removing the impurities caused by the polishing process (S40). The cleaning process may be performed on the first metal layer 130, the second metal layer 140, and the insulating layer 120.

The cleaning solution may be the etching composition according to embodiments. In an embodiment, the cleaning solution may include hydrogen peroxide having a content of about 1 wt % to about 7 wt %, phosphoric acid having a content of about 20 wt % to about 80 wt %, an amine or amide polymer having a content of about 0.001 wt % to about 1 wt %, sulfuric acid having a content of about 0 wt % to about 55 wt %, and deionized water having a content of about 10 wt % to about 45 wt %. The cleaning process may be performed by spraying, as an example.

The first metal layer 130, the second metal layer 140, and the insulating layer 120 are cleaned using the cleaning solution to remove the impurities caused by the polishing process. Additionally, top surfaces of the first and second metal layers 130 and 140 may be partially etched by the cleaning solution. A etch rate ratio of the first metal layer 130 to the second metal layer 140 may be about 10:1 or more in the cleaning process using the cleaning solution. The etch rate of the first metal layer 130 may be about ten or more times greater than the etch rate of the second metal layer 140 in the cleaning process using the cleaning solution. The etch rate of the first metal layer 130 by the cleaning solution may be about 100 Å/min or more. The first metal layer 130 may be etched faster than the second metal layer 140 during the cleaning process. Thus, the top surface of the cleaned first metal layer 130 may be lower than the top surface of the cleaned second metal layer 140.

The first metal layer 130 may function as a barrier layer. The second metal layer 140 may function as a plug, a contact, or a conductive line electrically connected to the lower structure 100.

According to embodiments, the cleaning process may be performed using the cleaning solution having the high etch-selectivity with respect to the second metal layer 140. Thus, it may be possible to prevent a reduction of a cross-sectional area of the second metal layer 140 by the cleaning process. As a result, a resistance increase of the second metal layer 140 functioning as the conductive line may be minimized or prevented.

Figure 7:
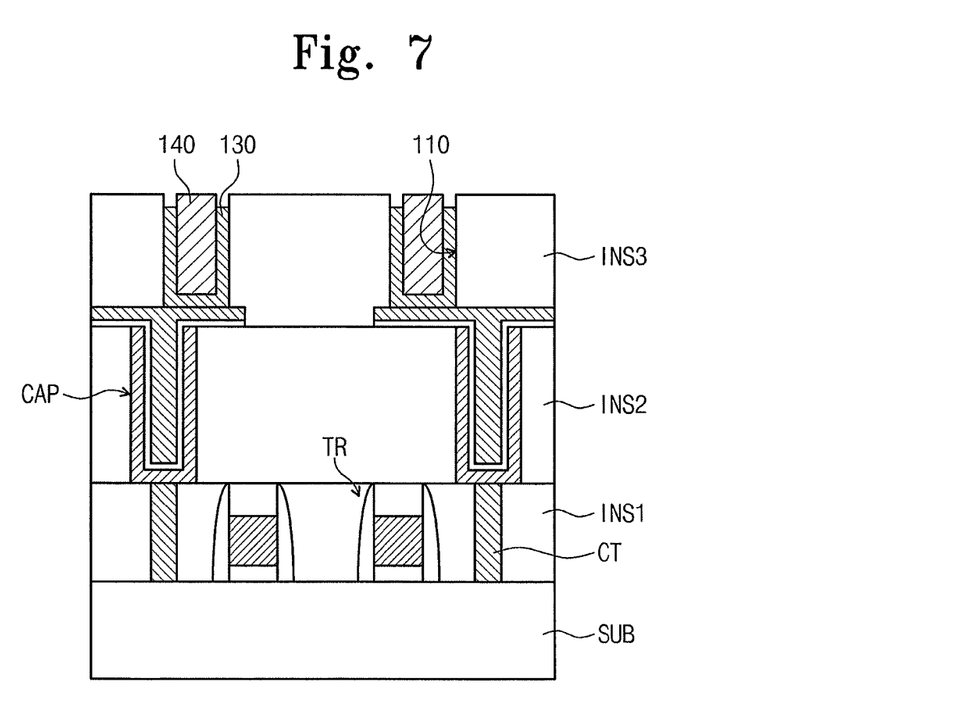
FIG. 7 illustrates a cross-sectional view depicting a method of manufacturing a semiconductor device according to another embodiment.

FIG. 7 illustrates a cross-sectional view depicting a method of manufacturing a semiconductor device according to another embodiment. In the present embodiment, the same elements as described in the aforementioned embodiment in FIGS. 1 to 6 are indicated by the same reference numerals or the same reference designators, and the descriptions to the same elements will not be repeated or will be mentioned briefly for the purpose of ease and convenience of explanation.

Referring to FIG. 7, a transistor TR and a first interlayer insulating layer INS1 covering the transistor TR may be formed on a substrate SUB. A lower contact CT may be formed to penetrate the first interlayer insulating layer INS1. The lower contact CT may be connected to the substrate SUB. A second interlayer insulating layer INS2 may be formed on the first interlayer insulating layer INS1 and then a capacitor CAP may be formed to penetrate the second interlayer insulating layer INS2. The capacitor CAP may be connected to the lower contact CT. Next, a third interlayer insulating layer INS3 may be formed to cover the capacitor CAP.

Thereafter, as described with reference to FIGS. 1 to 6, a recess 110 may be formed in the third interlayer insulating layer INS3. The recess 110 may penetrate the third interlayer insulating layer INS3 to expose a top surface of the capacitor CAP. The recess 110 may have a hole-shape or a linear shape extending in one direction. A plug, a contact, or a conductive line connected to the capacitor CAP may be formed in the recess 110.

A first metal layer 130 may be formed on the third interlayer insulating layer INS3 including the recess 110. The first metal layer 130 may be formed to partially fill the recess 110. In an implementation, the first metal layer 130 may include titanium (Ti) or titanium nitride (TiN). Next, a second metal layer 140 may be formed on the first metal layer 130. The second metal layer 140 may be formed to fill a remaining region of the recess 110. The second metal layer 140 may completely fill the recess 110. In an implementation, the second metal layer 140 may include tungsten (W).

Next, the second and first metal layers 140 and 130 may be polished. In more detail, a top surface of the second metal layer 140 and a top surface of the first metal layer 130 may be polished. The polishing process may be performed by a CMP process. The polishing process may be performed until a top surface of the third interlayer insulating layer INS3 is exposed. For removing impurities caused by the polishing process, the first and second metal layers 130 and 140 may be cleaned using a cleaning solution. The cleaning process may be performed on the first metal layer 130, the second metal layer 140, and the third interlayer insulating layer INS3.

The cleaning solution may be the etching composition according to embodiments. In an embodiment, the cleaning solution may include hydrogen peroxide of about 1 wt % to about 7 wt %, phosphoric acid of about 20 wt % to about 80 wt %, an amine or amide polymer of about 0.001 wt % to about 1 wt %, sulfuric acid of about 0 wt % to about 55 wt %, and deionized water of about 10 wt % to about 45 wt %. For example, the cleaning process may be performed by spraying.

The first and second metal layers 130 and 140 and the third interlayer insulating layer INS3 may be cleaned using the cleaning solution to remove the impurities caused by the polishing process. Additionally, top surfaces of the polished first and second metal layers 130 and 140 may be partially etched by the cleaning solution. A etch rate ratio of the first metal layer 130 to the second metal layer 140 may be about 10:1 or more in the cleaning process using the cleaning solution. The etch rate of the first metal layer 130 may be about ten or more times greater than the etch rate of the second metal layer 140 in the cleaning process using the cleaning solution. The etch rate of the first metal layer 130 by the cleaning solution may be about 100 Å/min or more. The first metal layer 130 may be etched faster than the second metal layer 140 during the cleaning process. The top surface of the cleaned first metal layer 130 may be lower than the top surface of the cleaned second metal layer 140.

In an embodiment, the first metal layer 130 may function as a barrier layer, and the second metal layer 140 may function as a plug, a contact, or a conductive line electrically connected to the capacitor CAP.

According to embodiments, the cleaning process is performed using the cleaning solution having the high etch-selectivity with respect to the second metal layer 140. Thus, it may be possible to prevent a reduction of the cross-sectional area of the second metal layer 140 by the cleaning process. As a result, a resistance increase of the second metal layer 140 functioning as the conductive line may be minimized or prevented.

Figure 8:
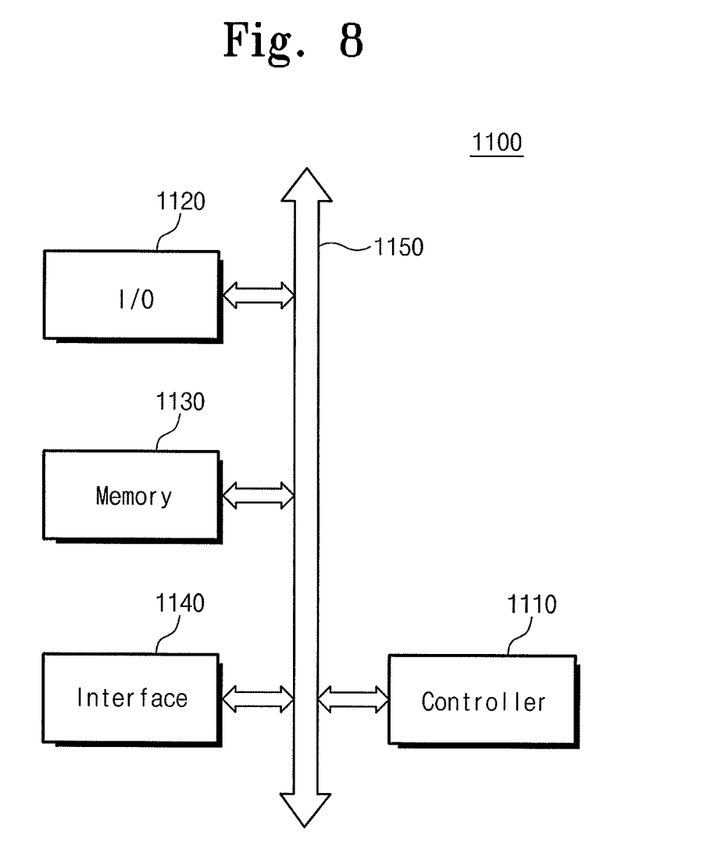
FIG. 8 illustrates a schematic block diagram depicting an example of an electronic device including an semiconductor device manufactured using an etching composition according to an exemplary embodiment.

FIG. 8 illustrates a schematic block diagram illustrating an example of electronic devices including semiconductor devices manufactured using an etching composition according to exemplary embodiments.

Referring to FIG. 8, an electronic device 1100 according to embodiments may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard and/or a display unit. The memory device 1130 may store data and/or commands. The memory device 1130 may include at least one of the semiconductor devices formed using the etching composition according to the aforementioned embodiments. The memory device 1130 may further include another type of semiconductor memory devices which are different from the semiconductor devices described above. The interface unit 1140 may transmit electrical data to a communication network or may receive electrical data from a communication network.

The electronic device 1100 may be applied to a laptop computer, a personal digital assistant (PDA), a portable computer, a web tablet, a wireless phone, a mobile phone, a digital music player, a memory card, or other electronic products.

Figure 9:
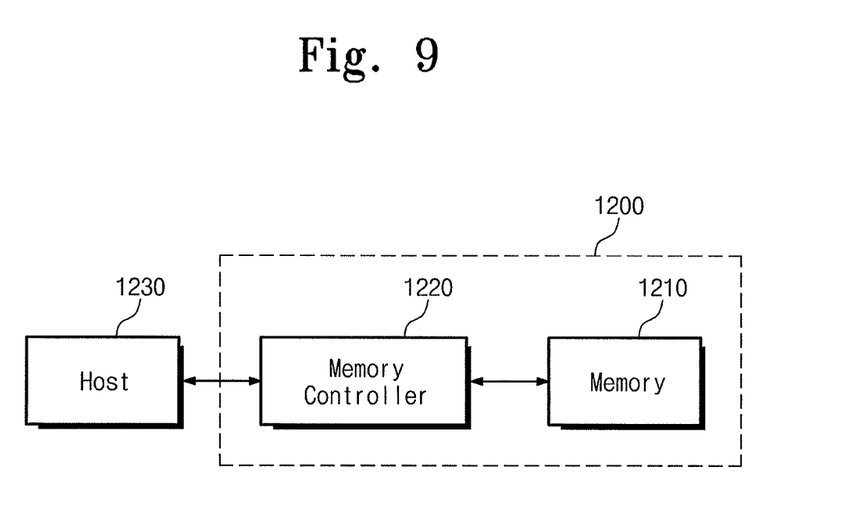
FIG. 9 illustrates a schematic block diagram depicting an example of a memory card including a semiconductor device manufactured using an etching composition according to an exemplary embodiment.

FIG. 9 illustrates a schematic block diagram illustrating an example of memory cards including semiconductor devices manufactured using an etching composition according to exemplary embodiments.

Referring to FIG. 9, a memory card 1200 may include a memory device 1210. The memory device 120 may include at least one of the semiconductor devices manufactured according to embodiments. Additionally, the memory device 1210 may further include other type of semiconductor memory devices that are different from the semiconductor devices according to the embodiments described above. The memory card 1200 may further include a memory controller 1220 that controls data communication between a host 1230 and the memory device 1210.

By way of summation and review, the reliability of semiconductor devices may be deteriorated as semiconductor devices become highly integrated. For example, if tungsten (W) is used as an electrical line in a semiconductor device and titanium/titanium nitride (Ti/TiN) is used as a barrier metal for adhesion between tungsten and silicon oxide, impurities may be generated around patterned tungsten and titanium/titanium nitride in a semiconductor manufacturing process. If a cleaning solution including only sulfuric acid and hydrogen peroxide ($H_2O_2$) or a cleaning solution including a chelating agent and an organic solvent is used for removing the impurities, a small amount of metal layers may be generally etched by the conventional cleaning solution including sulfuric acid and hydrogen peroxide ($H_2O_2$) or the conventional cleaning solution including a chelating agent and an organic solvent. Additionally, the conventional cleaning solutions may not have a high etch-selectivity of about 10:1 or more. Furthermore, other cleaning solutions may not etch the metal layer.

According to embodiments, the etching composition for etching the metal layer is provided to have high etch-selectivity. A semiconductor device may be manufactured using the etching composition, such that the resistance increase of the conductive line may be minimized or prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof.

What is claimed is:

1. A method of manufacturing a semiconductor device, the method comprising:
   forming a first metal layer on a substrate;
   forming a second metal layer on the first metal layer;
   polishing the first metal layer and the second metal layer; and
   cleaning the first metal layer and the second metal layer using a cleaning solution,
   wherein the cleaning solution includes:
      about 1 wt % to about 7 wt % of hydrogen peroxide;
      about 20 wt % to about 80 wt % of phosphoric acid having a content of;
      about 0.001 wt % to about 1 wt % of an amine or amide polymer having a content of;
      about 0 wt % to about 55 wt % of sulfuric acid having a content of; and
      about 10 wt % to about 45 wt % of deionized water having a content of.

2. The method as claimed in claim 1, wherein:
   the first metal layer includes titanium (Ti) or titanium nitride (TiN); and
   the second metal layer includes tungsten (W).

3. The method as claimed in claim 1, wherein cleaning the first metal layer and the second metal layer is performed such that a ratio of an etch rate of the first metal layer to an etch rate of the second metal layer by the cleaning solution is about 10:1 or more.

4. The method as claimed in claim 1, wherein cleaning the first metal layer and the second metal layer is performed such that an etch rate of the first metal layer by the cleaning solution is about 100 Å/min or more.

5. The method as claimed in claim 1, wherein cleaning the first metal layer and the second metal layer includes spraying the cleaning solution.

6. The method as claimed in claim 1, wherein forming the first metal layer includes:
   forming an insulating layer including a recess on the substrate; and
   depositing the first metal layer on the insulating layer,
   wherein the first metal layer is formed to partially fill the recess.

7. The method as claimed in claim 6, wherein forming the second metal layer includes filling a remaining region of the recess on the first metal layer.

8. The method as claimed in claim 7, wherein polishing the first metal layer and the second metal layer is performed until a top surface of the insulating layer is exposed.

9. A method of manufacturing a semiconductor device, the method comprising:
   providing an insulating layer having a recess;
   forming a first metal layer on a bottom surface and side surfaces of the recess and on a top surface of the insulating layer;
   forming a second metal layer on the first metal layer, the second metal layer filling a remaining portion of the recess;
   polishing the first metal layer and the second metal layer to expose the top surface of the insulating layer and to provide exposed top surfaces of the first metal layer and the second metal layer coplanar with the top surface of the insulating layer;
   cleaning the exposed top surfaces of first metal layer and the second metal layer using a cleaning solution that partially etches the first metal layer and the second metal layer, the cleaning solution having a high etching selectivity with respect to the second metal layer such that a top surface of the first metal layer as etched by the cleaning solution is lower, with respect to the top surface of the insulating layer, than a top surface of the second metal layer as etched by the cleaning solution,
   wherein the cleaning solution includes:
      about 1 wt % to about 7 wt % of hydrogen peroxide;
      about 20 wt % to about 80 wt % phosphoric acid;
      about 0.001 wt % to about 1 wt % of an amine or amide polymer;
      about 0 wt % to about 55 wt % of sulfuric acid; and
      about 10 wt % to about 45 wt % of deionized water.

10. The method as claimed in claim 9, wherein the amine or amide polymer includes at least one of poly(2-dimethylaminoethyl methacrylate), poly(2-methacryloxyethyltrimethylammonium bromide), poly(2-vinyl-1-methylpyridinium bromide), poly(2-vinylpyridine N-oxide), poly(2-vinylpyridine), poly(3-chloro-2-hydroxypropyl-2-methacryloxyethyldimethylammonium chloride), poly(4-aminostyrene), poly (2-vinylpyridine N-oxide), poly(4-vinylpyridine), poly (allylamine), poly(allylamine hydrochloride), poly (butadiene/acrylonitrile), amine terminated, poly (diallyldimethylammonium chloride), poly(ethylene glycol) bis(2-aminoethyl), poly(1-lysine hydrobromide), poly(N-methylvinylamine), poly(N-vinylpyrrolidone), poly(N-vinylpyrrolidone/2-dimethylaminoethyl methacrylate) dimethyl sulfate quaternary, poly(vinylamine) hydrochloride, polyaniline, or polyethylenimine.

11. The method as claimed in claim 9, wherein the amine or amide polymer is polyacrylamide or polyethylenimine.

12. The method as claimed in claim 9, wherein:
   the first metal layer includes titanium (Ti) or titanium nitride (TiN) and
   the second metal layer includes tungsten (W).

13. The method as claimed in claim 9, wherein a ratio of an etch rate of the first metal layer to an etch rate of the second metal layer by the cleaning solution is about 10:1 or more.

14. The method as claimed in claim 9, wherein an etch rate of the first metal layer by the cleaning solution is about 100 Å/min or more.

15. The method as claimed in claim 9, wherein the bottom surface of the recess is a top surface of a capacitor.

* * * * *